United States Patent [19]

Lechaton et al.

[11] Patent Number: 5,279,987

[45] Date of Patent: Jan. 18, 1994

[54] FABRICATING PLANAR COMPLEMENTARY PATTERNED SUBCOLLECTORS WITH SILICON EPITAXIAL LAYER

[75] Inventors: John S. Lechaton; Shaw-Ning Mei; Dominic J. Schepis, all of Wappingers Falls; Mithkal M. Smadi, Beacon, all of N.Y.

[73] Assignee: International Business Machines Corporation, Armonk, N.Y.

[21] Appl. No.: 785,656

[22] Filed: Oct. 31, 1991

[51] Int. Cl.$^5$ ............................................. H01L 21/20
[52] U.S. Cl. ...................................... 437/95; 437/59; 437/108; 148/DIG. 25
[58] Field of Search ............... 437/54, 59, 95, 97, 437/108, 112, 161, 952; 148/DIG. 7, DIG. 15, DIG. 25, DIG. 9

[56] References Cited

U.S. PATENT DOCUMENTS

| | | | |
|---|---|---|---|
| 3,716,422 | 2/1973 | Ing et al. | 437/97 |
| 4,578,128 | 3/1986 | Mundt et al. | 437/95 |
| 4,579,609 | 4/1986 | Reif et al. | 437/95 |
| 4,696,701 | 9/1987 | Sullivan | 437/95 |
| 4,830,973 | 5/1989 | Mastroianni | 437/31 |
| 4,859,626 | 8/1989 | Wise | 437/95 |
| 4,894,349 | 1/1990 | Saito et al. | 437/95 |

FOREIGN PATENT DOCUMENTS

| | | |
|---|---|---|
| 0320070 | 12/1988 | European Pat. Off. |
| 0148620 | 6/1988 | Japan ................................ 437/95 |

OTHER PUBLICATIONS

IBM Technical Disclosure Bulletin, by D. J. Fleming, et al., Entitled "Prevention of Audodoping During Silicon Epitaxial Deposition" vol. 20, No. 3, Aug. 1977, pp. 1083-1084.

IBM Technical Disclosure Bulletin, Entitled "Low Temperature Fabrication Process for High-Performance MOSFETs," vol. 30, No. 9, Feb. 1988, pp. 450-451.

Tzu-Yin Chiu, et al., "Non-Overlapping Super Self-Aligned BiCMOS with 87ps Low Power ECL", IEDM, 1988, pp. 752-755.

Tzu-Yin Chiu, et al., Entitled "Suppression of Lateral Autodoping from Arsenic Buried Layer by Selective Epitaxy Capping", IEEE Electron Device Letters, vol. 11, No. 3, Mar. 1990, 123-125.

Y. Kobayashi, et al., Entitled "High Performance LSI Performance Technology: SST CBI-CMOS", IEDM, 1988, pp. 760-763.

T. Ishii, et al., Entitled "Silicon Epitaxial Wafer with Abrupt Interface by Two-Step Epitaxial Growth Technique", J. Electrochemical Soc., vol. 122, No. 11, 1975, pp. 1323-1531.

T. J. Donahue, et al., Entitled "Low Temperature Silicon Epitaxy Deposited by Very Low Pressure Chemical Vapor Deposition", J. Electrochem. Soc., vol. 133, No. 8, Aug. 1986, pp. 1697-1701.

H-R. Chang, Entitled "Autodoping in Silicon Epitaxy", The Journal of Electrochemical Society, vol. 132, No. 1, pp. 219-224, Jan. 1985.

*Primary Examiner*—Brian E. Hearn
*Assistant Examiner*—C. Chaudhari
*Attorney, Agent, or Firm*—Jeffrey L. Brandt; Harold Huberfeld

[57] ABSTRACT

A process, compatible with bipolar and CMOS silicon device manufacturing for fabricating complementary buried doped regions in a silicon substrate. An N+ doped region (12) is formed in the silicon substrate by known methods of arsenic doping and drive in. This is followed by depositing a first thin epitaxial silicon cap layer (14), under conditions of minimum N+ autodoping. Part thickness of this first epilayer is converted to oxide (18), and the oxide is patterned to provide apertures in an area where it is desired to form a P+ region. A P source material (20) is deposited and a drive in anneal is used to dope the silicon with P in the areas of the oxide aperture opening. Subsequent to drive in, the dopant source layer and the oxide mask is removed by wet etching. An oxide is regrown on the surface, including the P+ region (22), and subsequently the oxide layer is stripped in dilute hydrofluoric acid. Next a second epitaxial silicon layer (28) is deposited to make up the total epi thickness to a desired value, using process conditions of minimum P doping.

8 Claims, 3 Drawing Sheets

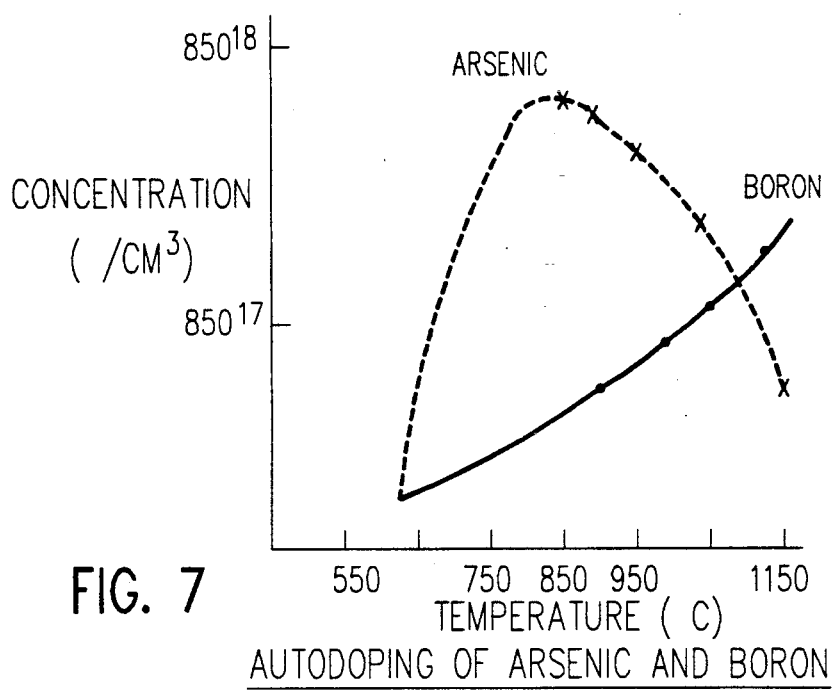
FIG. 7 AUTODOPING OF ARSENIC AND BORON
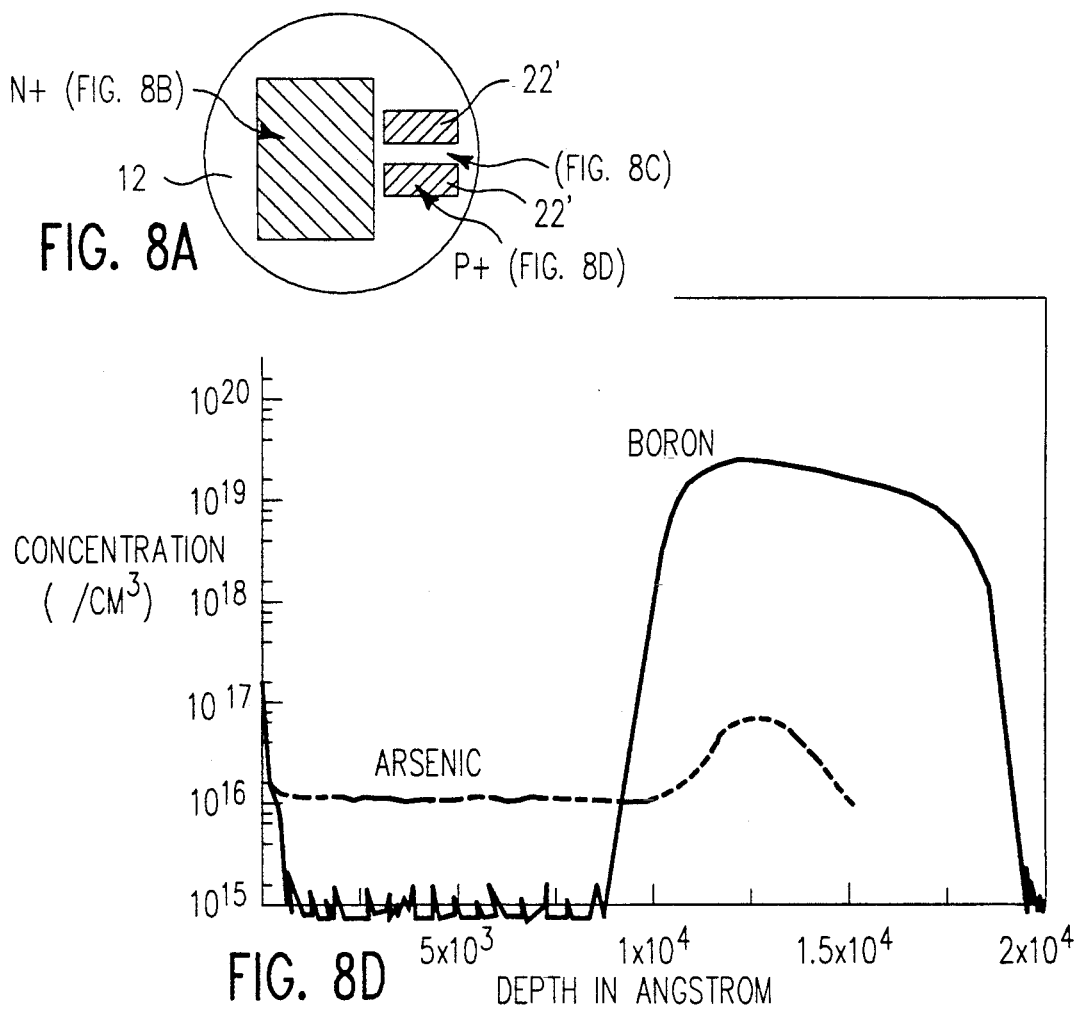
FIG. 8A
FIG. 8D

_

FABRICATING PLANAR COMPLEMENTARY PATTERNED SUBCOLLECTORS WITH SILICON EPITAXIAL LAYER

CROSS-REFERENCE TO RELATED APPLICATIONS

This application is related to co-pending application Ser. No. 59,377, filed Oct. 18, 1988.

FIELD OF THE INVENTION

The present invention relates generally to manufacturing semiconductor devices and more particularly to forming patterned complementary doped regions useful as sub-collectors for complementary bipolar or merged complementary bipolar complementary MOS (c-BiCMOS) devices.

BACKGROUND OF THE INVENTION

A necessary step in the fabrication of high performance complementary bipolar or c-BiCMOS transistors is the formation of highly doped co-planar sub-collector regions of both N and P type, with an epitaxial silicon layer disposed thereover. A major problem in the deposition of a silicon epitaxial layer over a highly doped sub-collector region is the evaporative loss of dopants from the region into the CVD chamber, and the resultant unwanted doping of areas adjacent to the region. This problem, referred to as autodoping, has been addressed extensively in the prior art. The avoidance of autodoping is more difficult when both N and P type regions are simultaneously present, because of their different autodoping responses under the same epitaxial process conditions.

The prior art relating to autodoping discusses the need for a suitable cap layer to reduce the out diffusion of the dopants, and describes various process steps for forming such a cap layer. A typical cap layer is a thin layer of epitaxial silicon with low dopant concentration and high resistivity. See for example U.S. Pat. No. 4,696,701 to Sullivan.

Depending on the desired results, the temperature of deposition for epitaxial silicon can be selected to be low (approximately 600 C), medium (approxi- mately 800 C) or high (approximately 1050), and pressure used is typically reduced (approximately 100 torr) or atmospheric. A high vacuum can be used in combination with a low temperature to improve film quality.

A study on autodoping by H. R. Chang reported the difference in the behavior of autodoping between N type impurities such as arsenic and antimony, and P type impurities such as boron (The Journal of Electrochemical Society, Vol. 132, No. 1, ppg. 219-224, August 1986). The study found that the autodoping of boron (P dopant) became worse at high temperature and at slow deposition rates of epitaxial silicon. Under these same conditions the autodoping of arsenic and antimony (N dopants) was minimal. At medium temperatures, the autodoping was minimal for P dopants and high for N dopants. At low temperatures, the autodoping of both N and P dopants are lower; however, the epitaxial silicon films tend to have higher defects than desired for most applications. FIG. 7 shows the autodoping of arsenic and boron measured by the present inventors at different epitaxy deposition temperatures. The data shows that finding common conditions resulting in low autodoping of both boron and arsenic is difficult.

The epitaxial deposition of silicon has been extensively discussed in the literature, especially the process conditions such as precleans, temperature, pressure, flow and gases, and their effect on growth rates and the epitaxy film properties.

Another area wherein autodoping is an important factor is in the manufacture of complementary bipolar and BiCMOS devices, for which highly doped patterned regions of both N and P type are required in the manner described herein above. U.S. Pat. No. 4,830,973 to Mastroianni, for example, shows methods and means for forming merged bipolar and MOS devices, but fails to teach how to avoid the autodoping when both N and P doped regions are simultaneously present and subjected to an epitaxial deposition process.

Chiu et al., (IEDM 1988, p752; also, IEEE Electron Dev. Let. 1990, p123) teaches the fabrication of a self-aligned BiCMOS device by deposition of a thin epitaxy silicon cap layer selectively over an arsenic doped region, followed by non-selective deposition of an epitaxial layer to desired thickness. Next, a boron doped region is formed by implantation through the epitaxy layer. However, the Chiu et al. process suffers from the disadvantage that it is limited to implantation method for doping, and hence can not achieve very high boron concentration (greater than $10^{19}$ atoms/cc). Boron concentration by implantation is usually restricted to $5 \times 10^{18}$ atoms/cc to avoid damage to the crystal, whereas higher concentrations are typically desirable. In addition the structure, consisting of the doped regions with an epitaxial silicon overlayer, resulting from this Chiu et al. process, is non-planar.

Thus the present invention recognizes that it would be particularly valuable in the art, especially as it relates to the formation of complementary circuits, to provide a planar device, tightly spaced and highly doped N and P regions, desirably with an epitaxy silicon overlayer, and a method of fabricating such a device with low autodoping from the dopant regions.

OBJECTS OF THE INVENTION

Accordingly an object of the present invention is to provide a method of fabricating complementary, closely spaced, highly doped regions on a substrate with an epitaxial silicon over-layer of device quality.

It is a further object of this invention to provide such a method with minimal autodoping effects.

It is yet another object of this invention to provide such a method that yields an essentially planar structure.

It is yet another object of this invention to provide a process compatible with semiconductor device processing, especially processing of complementary bipolar and BiCMOS devices.

It is yet another object of the present invention to provide a semiconductor device with highly doped ($10^{19}$ to $10^{20}$ dopants /cc) complementary regions, the top of the doped regions approximately at same level, with an epitaxial silicon over-layer of device quality suitable for high performance circuits.

SUMMARY OF THE INVENTION

A new device containing highly doped buried complementary regions, co-planar, and with a device quality epitaxial overlayer, suitable for high performance complementary circuits is disclosed. A new and improved method is provided for forming buried doped regions in a semiconductor substrate. In this invention, the N+ doped regions are formed in the silicon substrate by known methods of dopant implantation and activation. This is followed by depositing a first thin epitaxial silicon cap layer under selected conditions. A partial thickness of said first epitaxial layer is oxidized to form a layer of silicon dioxide. This oxide layer is patterned to provide an aperture in areas as desired. The substrate under the aperture opening is doped with P dopants from a deposited, solid source layer, by a drive in anneal. Subsequent to drive in, the P source layer is removed along with the said oxide layer containing the aperture. The entire surface is oxidized to a determined thickness and subsequently the oxide layer is stripped by wet etching. Next a second epitaxial silicon layer is deposited under different selected conditions to make up the total epitaxy thickness to a desired value, thus completing the formation of buried doped regions with an epitaxial silicon layer thereover.

BRIEF DESCRIPTION OF THE DRAWING

The objects, features, and advantages of the invention will be apparent from the following more particular description of the invention as illustrated in the accompanying drawings, in which:

FIG. 7 is a graph showing the experimental results of autodoping from boron and arsenic regions at different temperatures of epitaxial deposition.

DETAILED DESCRIPTION OF THE INVENTION

Figure 1:
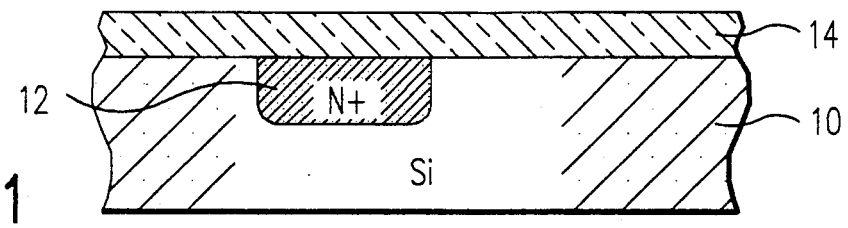
FIGS. 1-6 are cross sectional views illustrating consecutive steps in the formation of complementary doped regions in accordance with the present invention.

Referring now to the drawings, FIG. 1 shows an implanted heavily arsenic doped region 12 formed at a desired location on a silicon substrate 10, by well established techniques (not shown) of photoresist patterning, ion implantation and removing the resist mask by ashing or other suitable techniques. This is followed by a drive in anneal sufficient to activate the doped region, while simultaneously growing 3000 A of silicon dioxide by thermal oxidation. This oxide layer is stripped thus removing the damaged layer from the implantation. The dopant concentration is in the range of $10^{20}$–$10^{21}$ dopants/cc, with the sheet resistivity of the layer less than 100 ohms/square, preferably 10 ohms/square.

A thin cap layer 14, in the range of 1500 to 3000 A thick and preferably about 2000 A of intrinsic epitaxial silicon is deposited under conditions of low arsenic autodoping. The preferred conditions for formation of the cap layer 14 include a two step process of 1) deposition of 1000 A of intrinsic silicon under high temperature and low pressure conditions, for example at about 1050° to 1200° C. and 20 to 100 torr, followed by 2) deposition of 1000 A of intrinsic silicon at about 900 C and 20 to 100 torr.

Figure 2:
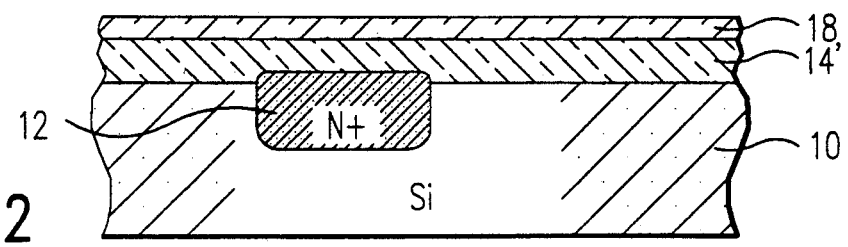

With reference now to FIG. 2, an oxide layer 18, in the thickness range of 500 to 1500 A, is grown on cap layer 14, by a conventional process of thermal oxidation, such that part of the cap layer 14 is converted to silicon dioxide. Layer 14' represents the unoxidized part of cap layer 14. The region 12 has slightly expanded into layer 14' by arsenic outdiffusion from the thermal oxidation process.

Figure 3:
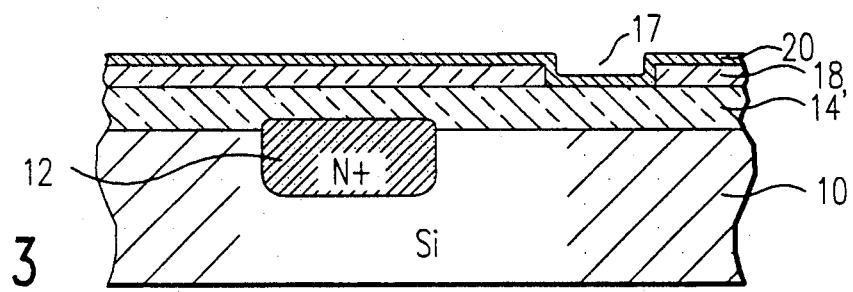

With reference to FIG. 3, using a resist mask formed by conventional photoresist process (not shown), an aperture 17 is formed in oxide layer 18, for example by etching out the oxide in dilute buffered hydrofluoric acid, at a location selected for a complementary P+ region formed in the manner described below. The resist is removed by conventional ashing and wet cleaning processes, such as hot sulfuric/nitric cleaning. A layer 20 of boron (P dopant) containing borosilicate glass in the thickness range of 1000 to 2000 A is deposited conformally in a known manner over the surface of the structure by low pressure CVD or other processes.

Figure 4:
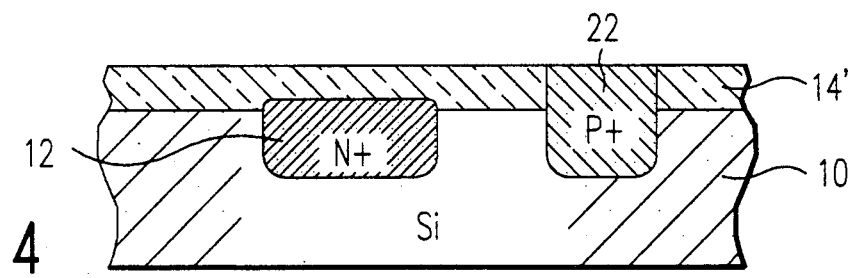

With reference to FIGS. 3 and 4, a thermal anneal, typically 900° to 1000° C. for thirty to sixty minutes, is used to drive P dopants from layer 20 into the substrate 10, thereby to form a P+ region 22 corresponding in location to aperture 17. The P dopant concentration is preferably about $10^{20}$ dopants/cc, and the sheet resistance of the doped region is below 100 ohms, preferably about 60 ohms. Diffusion elsewhere from layer 20 is retarded by the presence of silicon dioxide layer 18. The boron source layer 20, is typically removed by wet etching for example in dilute HF solution. This wet etching also removes the oxide layer 18, thereby presenting the planar surface of layer 14' as shown in FIG. 4. Continued arsenic outdiffusion from the drive-in process, raises the top level of region 12 further into layer 14', and region 12' represent the expanded region 12. The effective height difference between the top surface of region 12' and the top surface of region 22 is reduced and the separation is less than the thickness of layer 14'.

Figure 5:
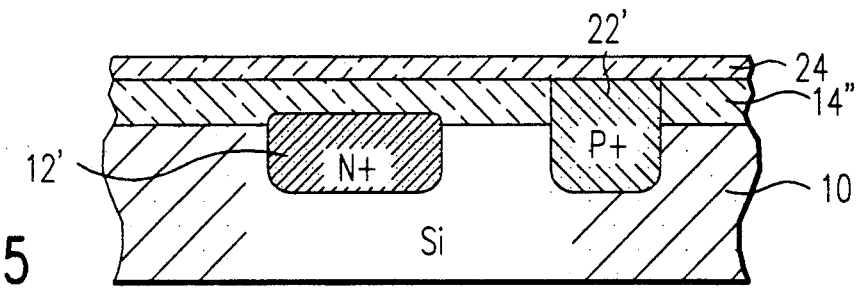

With reference to FIG. 5, a thin screen oxide layer 24 is grown conformally over the entire surface, including over P+ doped region 22 and the epitaxial silicon layer 14'. The formation of oxide layer 24 and its subsequent removal serves to, first, remove the surface layer, second, reduce the surface concentration of P dopants and third, further reduce the difference in the top surface of N doped region 12' and P doped region 22, making them more planar.

Figure 6:
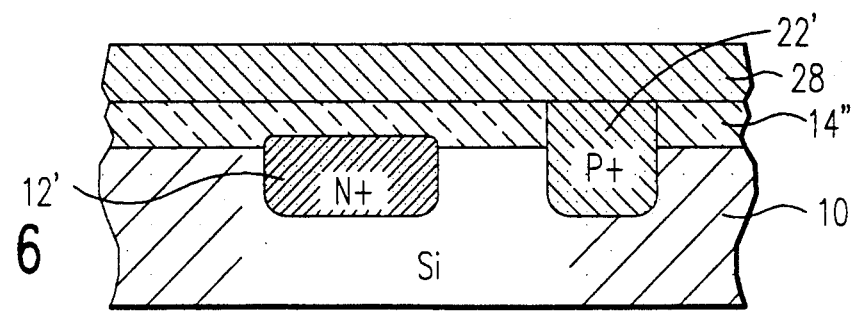

With reference now to FIG. 6, an epitaxial silicon layer 28 is deposited conformally over the structure including P+ region 22' to provide a total thickness of one to two microns desirable for subsequent processing. The selected process for depositing layer 28, is to minimize autodoping from the P+ regions, for example a two step process of 1) depositing 1000 A at about 800 to 900 C and about 200 to 700 torr, followed by 2) depositing the rest of the epitaxial silicon to the desired thickness at about 900° to 1100° C. but at a reduced pressure preferably at about 20 to 100 torr. The initial 1000 A at medium temperature, high pressure condition minimizes the P autodoping, and the subsequent reduced pressure condition gives low defect, device quality epitaxy silicon suitable for high density device application. A device quality epitaxy silicon film is defined here as one with average defects of less than one defect per square centimeter area. The presence of part of the layer 14' covering over N+ region prevents the N autodoping from N+ region at medium temperature and high pressure condition, desirable for capping P+ region.

With reference to FIG. 7, it is seen that N and P type dopants autodope differently at medium and high epitaxy temperature, conditions where device quality epitaxial deposition is usually achieved. At low temperatures, where both N and P have low autodoping, device quality epitaxial films are difficult to achieve.

Figure 8B:
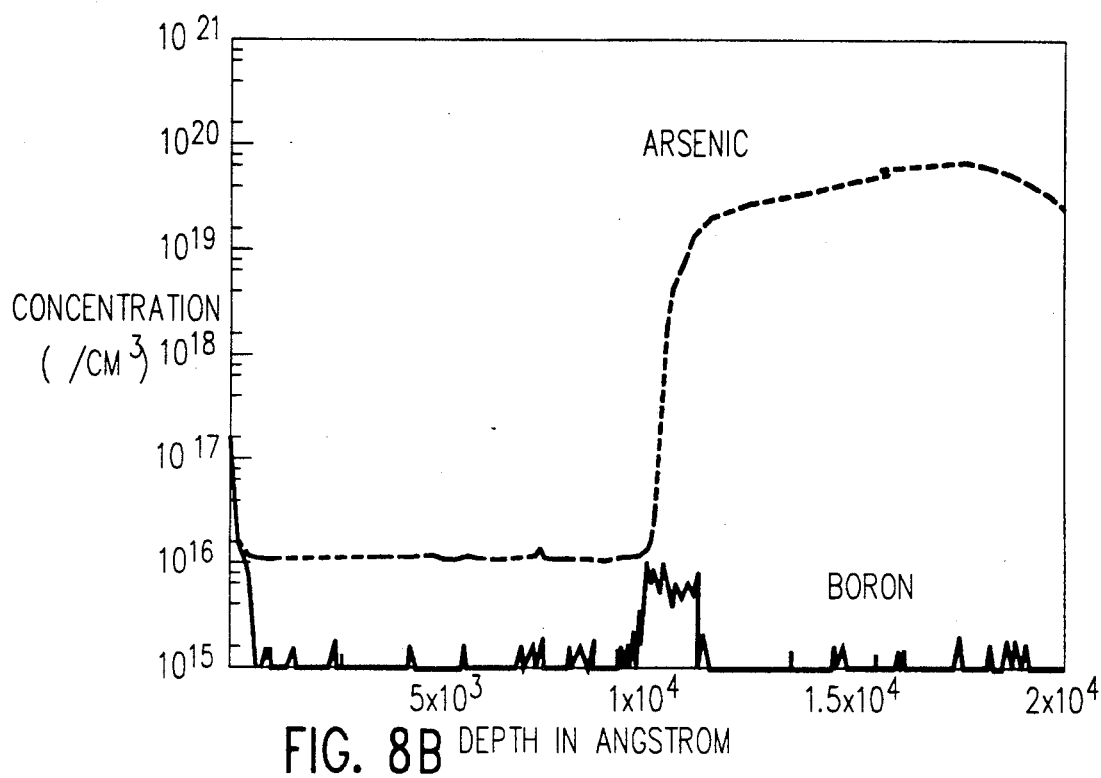
FIGS. 8B,C,D are graphs showing the depth profiles of arsenic and boron concentration from three regions in a completed device, the N+ region, the undoped region and the P+ region.
Figure 8C:
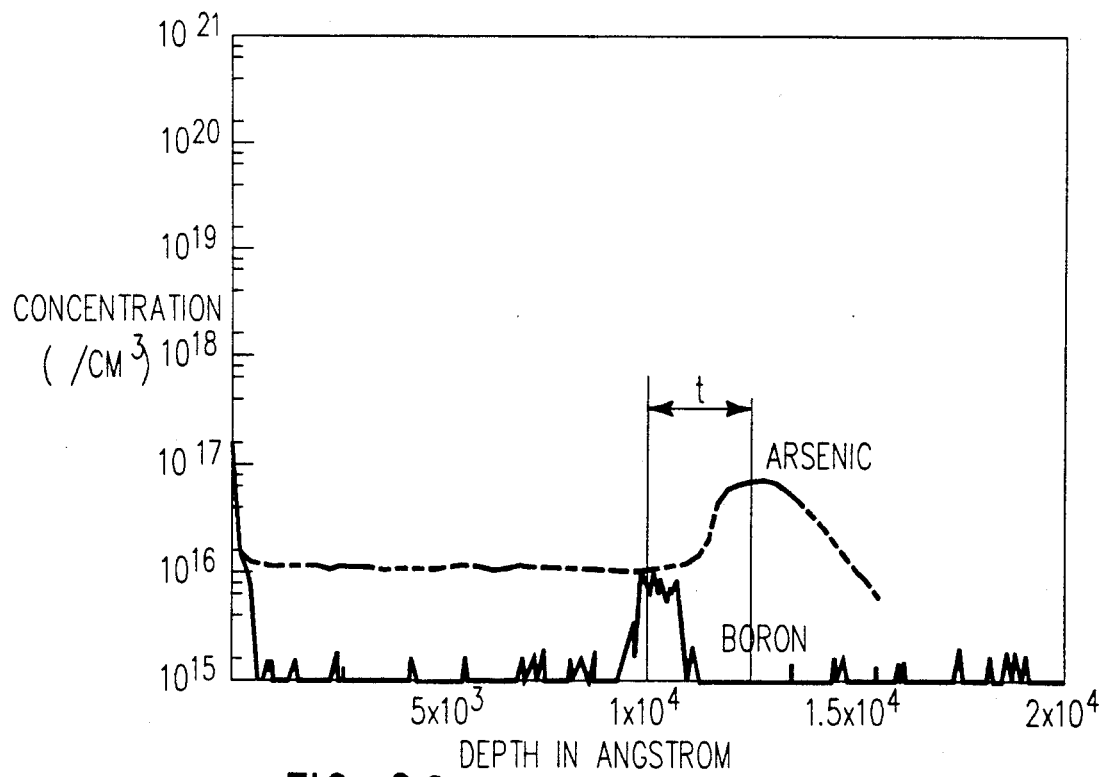
FIG. 8A is a top view of a magnified area of a silicon wafer fabricated in accordance with the present invention, showing the doped N+ regions, P+ region and the remaining regions.

With reference to FIGS. 8A-8D, the dopant concentration in a completed device containing both N+ and P+ regions have been shown. FIG. 8A is a magnified area from the wafer, showing the N+, P+ doped regions, and the remaining silicon, all covered with an epitaxial silicon overlayer. FIG. 8B-8D shows the dopant concentration of As and B in a selected region, from the surface to below. The horizontal units refer to thickness in angstrons, and the vertical units refer to number of dopant atoms per cubic centimeter of silicon volume. The zero angstron location correspond to the top surface of the epitaxial silicon overlayer. Referring to FIG. 8B, the total epitaxial silicon overlayer is approximately 1 micron and the arsenic doped region has a depth of 1 um. FIG. 8D, shows similar results from a Boron doped region. The thickness of the epitaxial silicon cap layer over the N+ region is almost same as the P+ region (within 1500 A), showing that the doped complementary regions are co-planar. FIG. 8C shows arsenic and boron concentration from a neutral region adjacent to the doped regions. The concentration of arsenic and boron are quite small, $10*15$ to $10*16$, showing that the invention achieves the objective of low auto doping. The exact location of the arsenic peak and boron peak correspond to the surface level when the N+ and P+ doping was carried out, and the separation of the peaks shown as t in FIG. 8C is exactly same as the thickness of layer 14' shown in FIGS. 2-4. Thus the concentration profile from the neutral region act to finger print the process disclosed here.

There is thus provided a method for forming both N+ and P+ doped regions in a substrate that includes the separate selection and use of epitaxial capping processes for minimizing both N and P autodoping, thereby overcoming the need and difficulty to find a compromised process condition. The resulting silicon substrate including the complementary doped regions capped with a device quality epitaxial silicon layer is essentially planar. High boron dopant concentration ($10*19$ to $10*20$ atoms/cc) can be achieved through the use of a solid diffusion source layer. The present invention has utility in semiconductor device fabrication and particularly the formation of complementary bipolar or c-BiCMOS devices.

While the invention has been described in terms of a single preferred embodiment, various alternatives and modifications can be devised by those skilled in the art without departing from the invention. Accordingly, the present invention is intended to embrace all such alternatives and modifications which fall within the scope of the appended claims.

What is claimed is:

1. A method of manufacturing a substrate having complementary buried doped regions, comprising the steps:

providing a semiconductor substrate having a top surface;

doping said top surface to form a first buried region of N conductivity type;

depositing a first layer of epitaxial intrinsic silicon over said top surface;

oxidizing a partial thickness of said first layer of epitaxial intrinsic silicon to form a first layer of oxide;

patterning said first oxide layer to provide an aperture;

doping through said aperture to form a buried region of P type conductivity;

stripping said first oxide layer used to form the aperture;

oxidizing a partial thickness of said first layer of epitaxial region and said P doped region to form a second oxide layer;

stripping said second oxide layer; and depositing a second layer of epitaxial silicon over said first layer of epitaxial silicon.

2. The method as recited in claim 1, wherein the thickness of said first layer of epitaxy silicon is about 1500 to 3000 A thick, and the thickness of said first oxide layer is 500 to 1500A.

3. The method as recited in claim 1, wherein said buried region of P type conductivity is formed by the use of a solid dopant source, comprising borosilicate glass, 1000 to 2000 A in thickness, to thereby diffuse boron into said region.

4. The method as recited in claim 1, wherein said first layer epitaxial silicon is deposited by a two step process of 1) deposition of 1000 A at about 1050 to 1200 C and about 60 torr pressure, followed by the 2) deposition of the balance at about 900 C and at about 60 torr pressure.

5. The method as recited in claim 1, wherein said second layer of epitaxial silicon is deposited at about 900 C and at about 200 to 700 torr.

6. The method as recited in claim 1, wherein said second layer of epitaxial silicon is deposited by a two step process of 1 ) deposition of about 1000 A at about 850 C and at about 200 to 700 torr, followed by 2) deposition of the rest of the thickness at about 850 C and at about 100 torr.

7. The method as recited in claim 6, wherein the step two of the two step process, includes deposition of the expitaxial silicon at about 1100 C and about 100 torr.

8. The method as recited in claim 3, wherein said diffusion from said solid dopant source is performed at a temperature range of 900 to 1000 C for about 30 minutes.

* * * * *